(12) United States Patent
Hayashi et al.

(10) Patent No.: US 6,949,777 B2
(45) Date of Patent: Sep. 27, 2005

(54) METHOD OF CONTROLLING INSULATED GATE TRANSISTOR

(75) Inventors: Yutaka Hayashi, Tsukuba (JP); Hisashi Hasegawa, Chiba (JP); Yoshifumi Yoshida, Chiba (JP); Jun Osanai, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/410,240

(22) Filed: Apr. 9, 2003

(65) Prior Publication Data

US 2003/0218193 A1 Nov. 27, 2003

(30) Foreign Application Priority Data

Apr. 10, 2002 (JP) ........................................ 2002-108422

(51) Int. Cl.[7] ............................................. H01L 29/76
(52) U.S. Cl. ...................... 257/213; 257/219; 257/221; 257/347; 257/354; 438/149
(58) Field of Search ................................. 257/219, 221, 257/347, 354; 438/149

(56) References Cited

U.S. PATENT DOCUMENTS 6,184,556 B1 * 2/2001 Yamazaki et al. .......... 257/354
6,392,277 B1   5/2002 Mitani et al. ................ 257/347

FOREIGN PATENT DOCUMENTS

EP      1143527       10/2001
JP      99027585      6/1999

OTHER PUBLICATIONS

Casu M R et al: "Comparative analysis of PO–SOI active body–biasing circuits" 2000 IEEE International SOI Conference. Proceedings, Oct. 2, 2000–Oct. 5, 2000 pp. 94–95, XP002289022 Wakefield, MA, USA ISBN: 0–7803–6389–2 *the whole document*.

Kistler N et al: "Symmetric CMOS in fully–depleted silicon–on–insulator using P<+>–polycrystalline SiGe gate electrodes" Electron Devices Meeting, 1993. Technical Digest., International Washington, DC, USA Dec. 5–8, 1993, New York, NY, USA, IEEE, Dec. 5, 1993, pp. 727–730, XP010118301 ISBN: 0–7803–1450–6 *whole document*.

* cited by examiner

*Primary Examiner*—David Nelms
*Assistant Examiner*—Mai-Huong Tran
(74) *Attorney, Agent, or Firm*—Adams & Wilks

(57) ABSTRACT

An insulated gate transistor is comprised of a semiconductor thin film, a first gate insulating film formed on a main surface of the semiconductor thin film, a first conductive gate formed on the first gate insulating film, first and second confronting semiconductor regions of a first conductivity type insulated from the first conductive gate and disposed in contact with the semiconductor thin film, and a third semiconductor region of a second conductivity type opposite to the first conductivity type and disposed in contact with the semiconductor thin film. The insulated gate transistor is controlled by injecting carriers of the second conductivity type into the semiconductor thin film from the third semiconductor region, and thereafter applying a first electric potential to the first conductive gate to form a channel of the first conductivity type on a portion of the semiconductor thin film disposed between the first semiconductor region and the second semiconductor region.

43 Claims, 5 Drawing Sheets

METHOD OF CONTROLLING INSULATED GATE TRANSISTOR

BACKGROUND OF THE INVENTION

1. Field of the Invention

The present invention relates to an insulated gate field effect transistor and an integrated circuit built therefrom, and more specifically, to a technique which uses for a channel formation region a semiconductor thin film such as SOI (Semiconductor On Insulator) or SON (Semiconductor On Nothing). The semiconductor thin film is formed on an insulating substrate (SOI) in some cases, is suspended and held at both ends by substrates in a hollow state (SON) in some other cases, and has a projecting portion which is connected at one end to a substrate in still other cases.

2. Description of the Related Art

A method called a dynamic threshold voltage controlling method has been proposed as a measure to obtain high speed and low stand-by power consumption by keeping the absolute value of the gate threshold voltage large to reduce leak current of a transistor when it is not in operation whereas keeping the absolute value of the gate threshold voltage small when it is in operation.

The dynamic threshold voltage controlling method is made implementable by connecting a well to a gate electrode if the transistor is a bulk MOS transistor formed on a semiconductor substrate and by connecting a body to a gate electrode if the transistor is a partially depleted SOI MOS transistor, so that the gate electrode serves as a signal input terminal (Reference 1: F. Assadeargi, et al., "A Dynamic Threshold Voltage MOSFET (DTMOS) for Very Low Voltage Operation" AIEEE Electron Device Letters, Vol. 15, No. 12, pp. 510–512, December, 1994).

The term partially depleted SOI, abbreviated as PD SOI, refers to SOI in which a depletion layer spreads only partially in the depth direction of its semiconductor thin film to give it a neutral region. 'Body' is a simplified term for the above semiconductor thin film in which a channel is formed.

On the other hand, SOI in which a combination of the thickness and impurity concentration is such that the depletion layer covers the entire depth of the semiconductor thin film is called FD (fully depleted) SOI. In FDSOI, within a certain gate voltage range, the body under a gate is depleted for the entire depth to provide no neutral region. Therefore, unlike bulk MOS and PDSOIMOS, connecting the body to the gate and inputting an ON signal thereto does not help FDSOI much in controlling the absolute value of the threshold voltage of the transistor. This is because forward bias between a source and a portion of the body that forms a channel is difficult to achieve when the body is depleted.

A patent on an insulated gate transistor structured to sandwich a semiconductor between two conductive gates through air gaps was granted in U.K. in 1935 to o. Heil. However, it did not mention or even hinted that a transistor having this structure is applicable to prevent so-called short channel effect in a micro-channel transistor.

In contrast, a transistor structure in which a fully depleted (FD) semiconductor thin film is sandwiched between a first conductive gate and a third conductive gate with a gate insulating films has been proposed by an inventor, for the first time in the record, as a measure to overcome the limit of miniaturization of single gate MOS transistors which have come into practical use in recent years. The name the inventor has given to a transistor that has this structure is XMOS transistor (Reference 2: T. Sekigawa, Y. Hayashi, K. Ishii, S. Fujita, "MOS Transistor for a 3D-IC", A $17^{th}$ Conference on Solid State Devices and Materials, Tokyo, 1985, Final Program and Late News Abstract, C-3-9 LN, pp. 14–16. Reference 3: Hayashi, "A Guide to Device Design Effective in the Coming Age of 0.025 $\mu$m", Nikkei Microdevice July 1988, pp. 121–125.). Lately, many have published the fruition of their miniaturization research by the name of double gate MOS transistor.

Transistors having this structure are known to be capable of changing the gate threshold voltage viewed from a first gate by the electric potential of a third conductive gate. However, when the electric potential of the third conductive gate is fixed, the sub-threshold slope is increased and the ON-OFF transition voltage becomes large to give these transistors a drawback of poor switching efficiency. In addition, the method of controlling the threshold voltage solely by the third conductive gate electric potential has a drawback that the variable range of the threshold voltage is too limited. Another problem of this method is that, when applied to the SOI structure and the like in which the third conductive gate is placed on the back side of the semiconductor thin film, the method requires excess area and process steps for taking out an electric connection wire from the third conductive gate of each transistor.

SUMMARY OF THE INVENTION

The present invention has been made in view of the above, and an object of the present invention is therefore to provide a technique of changing through electronic controlling the gate threshold voltage of when an FDSOI transistor is in operation from the one when it is not in operation, and a transistor that embodies this technique. Another object of the present invention is to provide a technique, for an insulated gate transistor in which a depleted semiconductor thin film is sandwiched between a first conductive gate and a third conductive gate through a gate insulating films as is represented by double gate MOS transistors, that is capable of electronically controlling the gate threshold voltage without changing the electric potential of the third conductive gate, and to provide such transistor.

Thus, according to the present invention, as shown in an example of a sectional view of FIG. 1, an insulated gate transistor is composed of: a semiconductor thin film 100 having a first principle surface 101 and a second principle surface 102 that faces the first principle surface; a first gate insulating film 210 formed on the first principle surface of the semiconductor thin film; a first conductive gate 310 formed on the first gate insulating film; a first semiconductor region 110 and a second semiconductor region 120 which face each other across the first conductive gate, which are insulated from the first conductive gate, which are in contact with the semiconductor thin film 100, and which have a first conductivity type; and a third semiconductor region (not shown) which has the opposite conductivity type and which is in contact with the semiconductor thin film. Further, in the semiconductor thin film 100 in which a first conductive gate electric potential causes depletion of carriers between the first principle surface 101 and the second principle surface 102 between the first and second semiconductor regions below the first conductive gate, there is adopted a method in which after carriers 2 of the opposite conductivity type are injected into the thin film from the third semiconductor region of the opposite conductivity type, a first electric potential is subsequently applied to the conductive gate to induce a channel of the first conductivity type on a surface of the semiconductor thin film that is sandwiched between the first semiconductor region and the second semiconductor region.

The third semiconductor region, which is not shown in FIG. 1, is, for example, positioned so as to have a contact with an extended portion of the semiconductor thin film 100 extended in the direction perpendicular to the plane of the drawing. The semiconductor thin film 100 in FIG. 1 is supported by a substrate 10 having an insulating layer 20 formed on its surface. In most cases, the substrate 10 is formed of silicon and the insulating layer 20 is a silicon oxide film. The supporting substrate that has an insulating layer on its surface is called an insulating substrate. An insulating substrate that is entirely formed of an insulating material, such as a quartz substrate, can also serve as the supporting substrate. An alternative structure (which will be described later in embodiments) is that one end of the semiconductor thin film, or an end of the first semiconductor region, the second semiconductor region, or the third semiconductor region, is supported by a substrate.

According to a second method of the present invention, on the other hand, the gate threshold voltage viewed from the first conductive gate is controlled by controlling for a fixed period the amount of carriers of the opposite conductivity type which are accumulated in the semiconductor thin film through supply of carriers of the opposite conductivity type from the third semiconductor region of the opposite conductivity type into a portion of the semiconductor thin film that is sandwiched between the first semiconductor region and the second semiconductor region, or through absorption of those carriers into the third semiconductor region. This method is suitable for an insulated gate transistor that is structured to sandwich a depleted semiconductor thin film between a first conductive gate and a third conductive gate through a gate insulating film.

The gate voltage necessary to induce a channel of a first conductivity type in the semiconductor thin film to which the carriers of the opposite conductivity type are injected is reduced by a level corresponding to the number of the implanted carriers of the opposite conductivity type or electric charges. This means that the gate threshold voltage has shifted toward the depletion side equivalently. If the gate threshold voltage changes in an enhancement type range, it means that the absolute value of the gate threshold voltage is reduced.

In the present invention, the third semiconductor region of the opposite conductivity which is higher in impurity concentration than the semiconductor thin film is provided in the semiconductor thin film in order to inject the carriers of the opposite conductivity type into the semiconductor thin film or to draw the carriers of the opposite conductivity type from the semiconductor thin film. When the third semiconductor region with respect to the first or to the second semiconductor region are biased forward, carriers of the opposite conductivity type are injected into the semiconductor thin film. After the injection, the carriers of the opposite conductivity type are accumulated in the semiconductor thin film but, unless supplied continuously, the amount of carriers accumulated diminishes and eventually none remains as the lifetime of carriers expires.

On the other hand, depending on the surface electric potential of the semiconductor thin film, carriers of the opposite conductivity type which are generated by heat or by avalanche multiplication in a high field effect region may accumulate in the semiconductor thin film and change the gate threshold voltage viewed from the first conductive gate. If these carriers of the opposite conductivity type that are unintentionally accumulated are drawn from the semiconductor thin film into the third semiconductor region, the gate threshold voltage can be controlled and set to an intended level. To draw the carriers into the third semiconductor region, a substantial zero bias or reverse bias is supplied between the third semiconductor region and the first or second semiconductor region.

Furthermore, the method and insulated gate transistor of the present invention are capable of controlling the gate threshold voltage by the electric potential of the third semiconductor region. This method, when applied to an insulated gate transistor that is structured to sandwich a depleted semiconductor thin film between a first conductive gate and a third conductive gate through gate insulating films, can control the gate threshold voltage viewed from the first conductive gate steadily by controlling the accumulated amount of carriers of the opposite conductivity type in the semiconductor thin film utilizing the electric potential of the third semiconductor region which is relative to the electric potential of the third conductive gate.

DETAILED DESCRIPTION OF THE PREFERRED EMBODIMENTS

Embodiment Mode

As a mode of effectively carrying out the present invention, an end of the third semiconductor region is placed within a distance in which carriers of the opposite conductivity type diffuse from a portion of the semiconductor thin film that is sandwiched between the first semiconductor region and the second semiconductor region in order to deliver carriers of the opposite conductivity type from the third semiconductor region to a portion of the semiconductor thin film where a channel is formed or in order to draw the carriers from this portion into the third semiconductor region.

Figure 1:
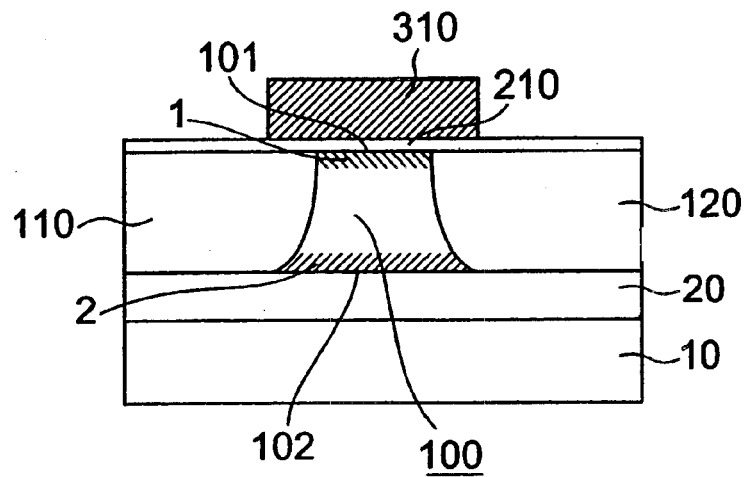
FIG. 1 is a sectional view showing the principle of a gate threshold voltage controlling method for an insulated gate thin film transistor of the present invention.
Figure 2A:
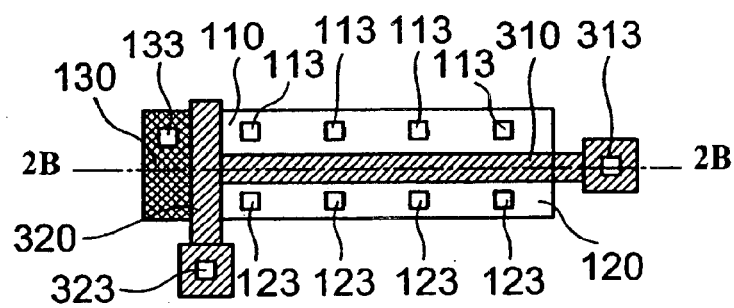
FIGS. 2A and 2B are a plan view of an insulated gate thin film transistor formed on an SQI substrate in accordance with an embodiment of the present invention and a sectional view in FIG. 2A along the line 2B—2B, respectively.
Figure 2B:
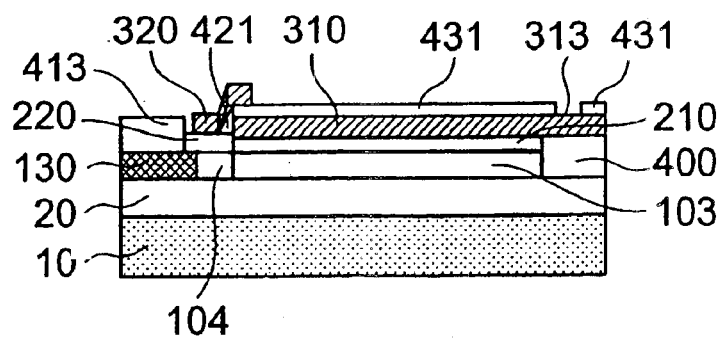

Another mode of a transistor for effectively carrying out the present invention is an insulated gate transistor shown in FIGS. 2A and 2B. In this transistor, the semiconductor thin film is extended to the third semiconductor region, which is denoted by 130, from the semiconductor thin film portion which is denoted by 103 and which is sandwiched between the first semiconductor region denoted by 110 and the second semiconductor region denoted by 120. In an embodiment of the present invention, the semiconductor thin film portion 103 contains an n-type impurity in a dose of $1.2 \times 10^{12}$ to $1.6 \times 10^{12}$ atoms/cm$^2$. The extended portion of the semiconductor thin film is denoted by 104. A second gate insulating film 220 is formed on the extended portion 104 and a second conductive gate 320 is formed thereon.

FIG. 2A is a plan view of the above embodiment of the present invention whereas FIG. 2B is a sectional view taken along the line 2B—2B of the plan view. In FIGS. 2A and 2B, reference symbol 10 denotes a supporting substrate and 20 denotes an insulating film for insulating the semiconductor thin film from the supporting substrate. 113, 123, and 133 represent wiring contacts leading to the first, second, and third semiconductor regions, respectively. Denoted by 210 is a first gate insulating film, 400, a so-called field insulating film which is placed under an interconnection layer, and 431, an insulating film placed on a first conductive gate. 421 represents an inter-gate insulating film for insulating the first conductive gate and the second conductive gate, and 413 represents an insulating film formed on the third semiconductor region and others. 313 and 323 denote wiring contacts leading to the first and second conductive gates, respectively.

Described below is the transistor operation of when the first conductivity type is the n type and the opposite conductivity type is the p type. The principles and effects given in the following description also apply to the case where the first conductivity type is the p type, although the direction of symbol changes is reversed. ON voltage for transition from a low electric potential near zero to a first positive electric potential is applied to the first conductive gate. But first, a p-channel is induced in the semiconductor thin film below the second conductive gate with the third p type semiconductor region set to a second positive electric potential and the second conductive gate set to a low electric potential near zero or a negative electric potential, so that carriers of the opposite conductivity type, namely holes, are injected through the p-channel into the semiconductor thin film below the first conductive gate.

Figure 3:
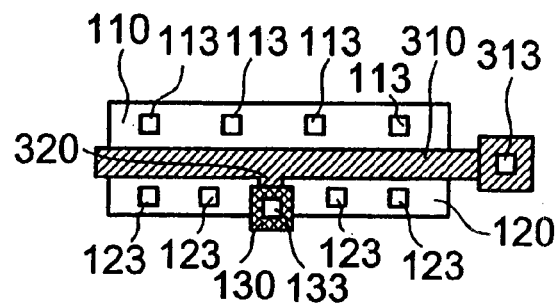
FIG. 3 is a plan view of an embodiment of the present invention in which a third semiconductor region is sandwiched between plural second semiconductor regions and a second conductive gate is continuous from a first conductive gate.

Here, the second positive electric potential is set such that the difference between the second positive electric potential and the electric potential of the second conductive gate is larger than the absolute value of a threshold Vthr of the second conductive gate with respect to carriers of the opposite conductivity type (p channel in this example). If the electric potential of the first conductive gate is a low electric potential near zero, holes are also injected and spread in the semiconductor thin film between the first and second semiconductor regions below the first conductive gate. The holes diffuse in the direction perpendicular to the direction connecting the first and second semiconductor regions which become an n-channel drain region and an n-channel source region. An example of a way to shorten the time to diffuse holes in a transistor whose n-channel has a large channel width is to divide the second semiconductor region into two and place the third semiconductor region between the two halves as shown in FIG. 3. This arrangement may be repeated in the lateral direction of the drawing to have plural third semiconductor regions.

In the example shown in FIG. 3, the first conductive gate and the second conductive gate are continuous. The structure of FIGS. 2A and 2B too can employ continuous first conductive gate and second conductive gate, which helps to reduce the number of input terminals and the area the transistor occupies. However, when the first conductive gate and the second conductive gate are continuous, the electric potential range of the third semiconductor region and the electric potential range of the continuous gates for injection of carriers of the opposite conductivity type are narrower than when separate gates are employed. The manufacture process may be shortened by using one insulating film as the first gate insulating film and the second gate insulating film.

Figure 4:
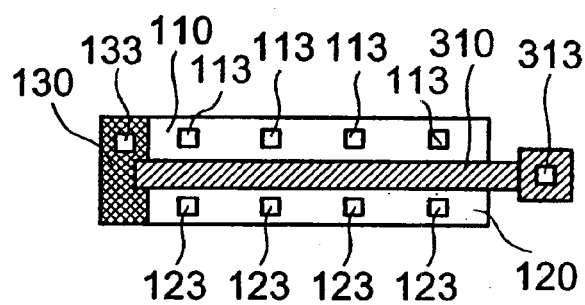
FIG. 4 is a plan view of an embodiment of the present invention in which a third semiconductor region is in contact with a portion of a semiconductor thin film that is sandwiched between first and second semiconductor regions, a second conductive gate is continuous from a first conductive gate, and a second gate insulating film is the same film as a first gate insulating film.

The third semiconductor region in FIG. 2A is in contact with the extended portion of the semiconductor thin film. The method of the present invention can be carried out also when the third semiconductor region is in contact with the portion of the semiconductor thin film that is sandwiched between the first and second semiconductor regions as shown in FIG. 4. This arrangement, however, has a drawback of increasing the junction capacitance because of a large possibility that the third semiconductor region comes into contact with the first or second semiconductor region.

The channel through which carriers of the opposite conductivity type are moved from the third semiconductor region is in the extended portion 104 of the semiconductor thin film. If a part of this channel is doped with an impurity having the first conductivity type (in the case where the semiconductor thin film is already doped with an impurity of the opposite conductivity type) or a high concentration impurity portion of the first conductivity type is formed in this channel, a barrier for preventing carriers of the opposite conductivity from flowing back to the third semiconductor region can be obtained. In this way, the gate threshold voltage of the opposite conductivity type carrier channel viewed from the second conductive gate is shifted to the enhancement side.

Figure 5A:
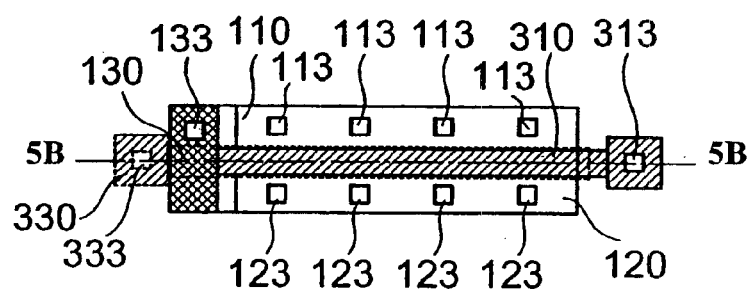
FIGS. 5A and 5B are a plan view and a sectional view along cross-sectional line 5B—5B in FIG. 5A, respectively, of when the present invention is applied to an insulated gate transistor that has a first conductive gate on the first principal surface side and a third conductive gate on the second principal surface side.
Figure 5B:
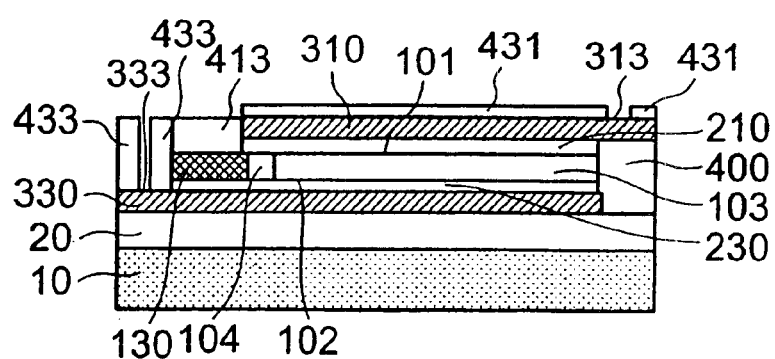

Another mode of a preferred transistor for effectively carrying out the present invention is an insulated gate transistor shown in FIGS. 5A and 5B. The transistor is characterized by including at least:

a semiconductor thin film (broken into portions 103 and 104) having a first principle surface 101 and a second principle surface 102 that faces the first principle surface;

a first gate insulating film 210 formed on the first principle surface of the semiconductor thin film;

a first conductive gate 310 formed on the first gate insulating film;

a first semiconductor region 110 and a second semiconductor region 120 which face each other across the first conductive gate, which are insulated from the first conductive gate, which are in contact with the semiconductor thin film, and which have a first conductivity type;

a third semiconductor region 130 which has the opposite conductivity type and which is in contact with the semiconductor thin film;

a third gate insulating film 230 formed on the second principle surface of the semiconductor thin film portion 103 that is sandwiched between the first semiconductor region and the second semiconductor region; and a third conductive gate 330 which is in contact with the third gate insulating film 230.

FIG. 5A is a plan view of the above embodiment whereas FIG. 5B is a sectional view taken along the line 5B—5B of the plan view. In FIGS. 5A and 5B, reference symbol 10 denotes a supporting substrate and 20 denotes an insulating film on a surface of the supporting substrate 10. 113 and 123 represent wiring contacts leading to the first and second semiconductor regions, respectively. 133 represents a wiring contact leading to the third semiconductor region. Denoted by 400 is a so-called field insulating film which is placed under an interconnection layer, 431, an insulating film placed on the first conductive gate, 413, an insulating film placed on the third semiconductor region and others, and 433, an insulating film placed on the third gate conductive film. 313 denotes a wiring contact leading to the first conductive gate. 333 denotes a wiring contact provided, if necessary, to lead to the third conductive gate. The third conductive gate 330 in the specific example shown in FIGS. 5A and 5B is long enough to reach the third semiconductor region 130 not directly but through the third gate insulating film 230. However, it is not always necessary to extend the third conductive gate this long.

In order to carry out the above embodiment of the present invention more effectively, an end of the third semiconductor region is placed within a distance in which carriers of the opposite conductivity type are diffused from the portion of the semiconductor thin film that is sandwiched between the first semiconductor region and the second semiconductor region in order to deliver without fail carriers of the opposite conductivity type to a portion of the semiconductor thin film that is between the first and second semiconductor regions and forms a channel. In this embodiment, the portion of the semiconductor thin film contains an n-type impurity in a dose of $1.2 \times 10^{12}$ to $1.6 \times 10^{12}$ atoms/cm$^2$.

The third conductive gate can be extended until it comes to an area below the third semiconductor region, which is on the third gate insulating film. Through a channel or depletion layer induced under the third gate, carriers of the opposite conductivity type are supplied from the third semiconductor region to the portion of the semiconductor thin film that is sandwiched between the first and second semiconductor regions, or are drawn from this portion of the semiconductor thin film into the third semiconductor region.

Described below is the transistor operation of when the first conductivity type is the n type and the opposite conductivity type is the p type. The principles and effects given in the following description also apply to the case where the first conductivity type is the p type, although the direction of symbol changes is reversed. When the electric potential of the second semiconductor region is 0 V and the electric potential of the third semiconductor region is 0 V, the threshold voltage of the first conductive gate is Vth10 and the threshold voltage of the third conductive gate with respect to carriers of the opposite conductivity type is Vthr30 (when the bias conditions are such that the first and third conductive gates are biased just to the respective threshold voltage).

For example, when the third conductive gate is biased so that the threshold voltage is set to (Vthr30−1) V and the third semiconductor region is biased to set its voltage V3 to −1 V, a gate threshold voltage Vth1 of the first conductive gate is increased to Vth1_−1.

Thereafter, the voltage V3 of the third semiconductor region is changed to 0 V or within a range of forward voltage to the second semiconductor region that does not cause a large current flow. In this case, the amount of change of the gate threshold voltage Vth1 of the first conductive gate from Vth1_−1 is denoted by ΔVth1 and Δth1 is expressed as ΔV3*(k3*t1/(k1*t3+αd)).

In the above expression, t1 and k1 are the thickness and dielectric constant of the first gate insulating film, respectively, t3 and k3 are the thickness and dielectric constant of the third gate insulating film, respectively, d represents the thickness of the semiconductor thin film and α is a number smaller than the dielectric constant of the semiconductor thin film, ΔV3 represents the amount of change of V3, * is a multiplication sign, and / is a division sign. This shows that the gate threshold voltage of the first conductive gate can be changed by the electric potential of the third semiconductor region without changing the voltage of the third conductive gate.

In a conventional transistor, the gate threshold voltage viewed from the first conductive gate is hardly changed when the third conductive gate is biased in the direction that makes the voltage of the third conductive gate exceed Vthr30 and induces more carriers of the opposite conductivity type into the semiconductor thin film (the negative direction if the opposite conductivity type is the p type). In contrast, the present invention is capable of widening the range of change of the gate threshold voltage by the electric potential of the third semiconductor region of the opposite conductivity type.

When the third conductive gate of the present invention is biased in the direction that makes the voltage of the third conductive gate approach Vthr30 or exceed Vthr30 and induces more carriers of the opposite conductivity type into the semiconductor thin film, it is also possible to control Vth by connecting the first conductive gate with the third semiconductor region and inputting a signal to the gate.

If the third conductive gate is formed from a semiconductor of the opposite conductivity type in the above embodiment, biasing the third conductive gate is unnecessary because of an incorporated voltage in the direction that induces carriers of the opposite conductivity to the second principle surface of the semiconductor thin film. In the case where the transistor does not have the third conductive gate, it is difficult to set the gate threshold voltage to the enhancement side by forming the gate from a semiconductor of a first conductivity type, forming the channel from a semiconductor of the opposite conductivity type, and utilizing the impurity concentration thereof as in prior art. This is because, in fully depleted SOI and SON, the semiconductor thin film is low in impurity concentration and small in thickness.

In this case, forming the first conductive gate from a semiconductor of the opposite conductivity type makes it easy to achieve the enhancement type change. Also, carrying out the method of the present invention securely becomes easier if the second conductive gate has the opposite conductivity type because then carriers of the opposite conductivity type can readily flow into the semiconductor thin film below the second conductive gate without applying a voltage whose polarity is opposite to the polarity of the power supply voltage to the second conductive gate. A semiconductor preferred as the material of these conductive gates is silicon or silicon germanium. In particular, p type silicon germanium containing 45% to 60% of germanium in average provides a preferable threshold voltage to a silicon n-channel insulated gate transistor.

Embodiments

Figure 6:
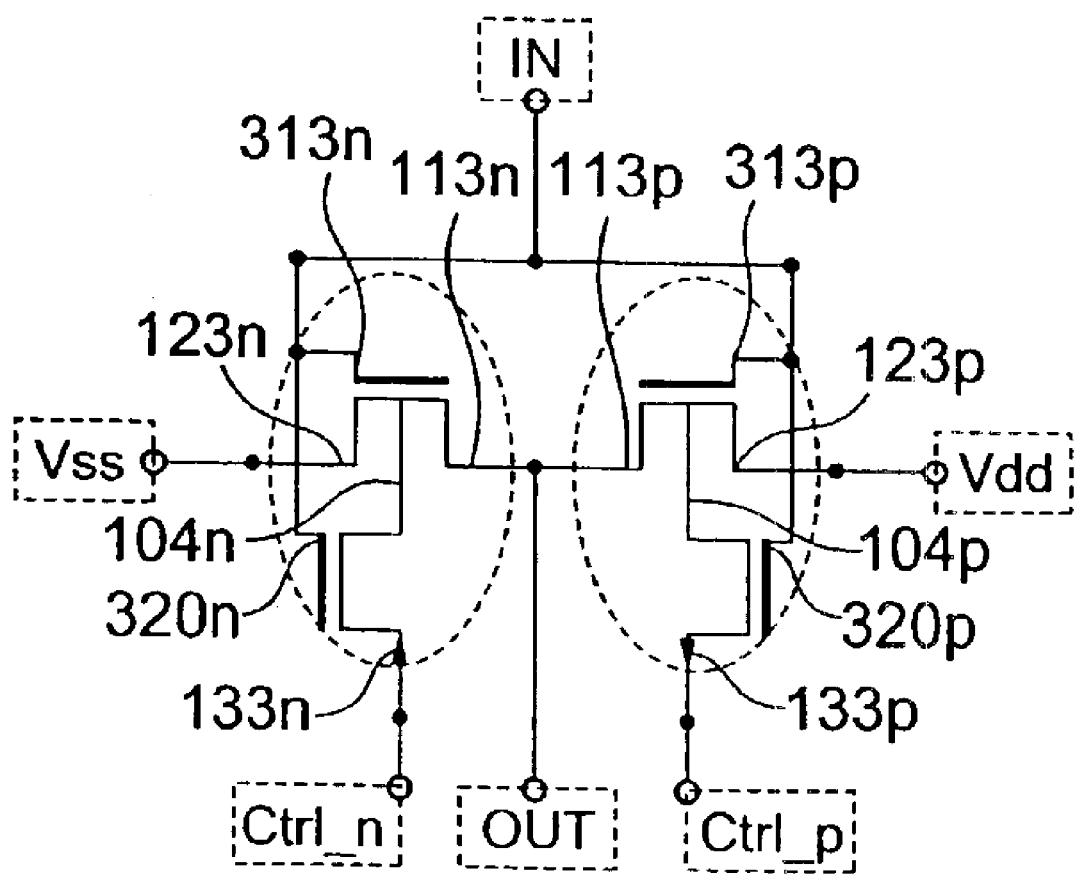
FIG. 6 is an equivalent circuit diagram of an embodiment in which the present invention is applied to a CMOS inverter.

FIG. 6 is an equivalent circuit diagram of a CMOS inverter which is an embodiment of the present invention. Denoted by 113*n* and 113*p* are drain terminals of an n-channel MOS transistor and a p-channel MOS transistor, respectively. 123n and 123p are source terminals of the n-channel and p-channel MOS transistors, respectively. 133n and 133p are control terminals of the transistors. 313n and 313p are first gate terminals of the transistors. 323n and 323p are second gate terminals of the transistors. The control terminals 133n and 133p are connected to the third semiconductor regions of the n-channel MOS transistor and the p-channel MOS transistor, respectively. In FIG. 6, IN represents an input terminal and OUT represents an output terminal. Ctrl_n and Ctrl_p are Vth control terminals of the n-channel and p-channel transistors, respectively. Denoted by Vdd is a power supply voltage terminal whereas Vss denotes a terminal for the lower power supply voltage and, in a digital circuit, usually has a ground electric potential.

Figure 7A:
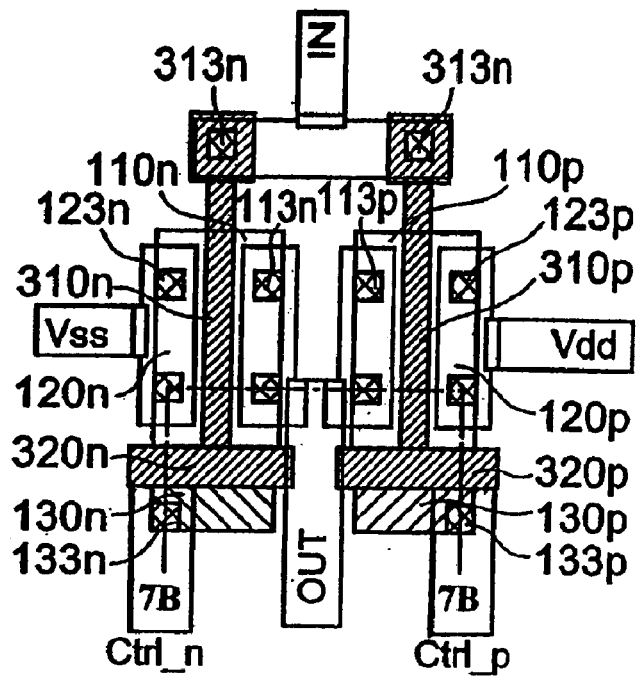
FIGS. 7A and 7B are a plan view of the inverter of FIG. 6 and a sectional view taken along the line 7B—7B in the plan view of FIG. 7A, respectively.
Figure 7B:
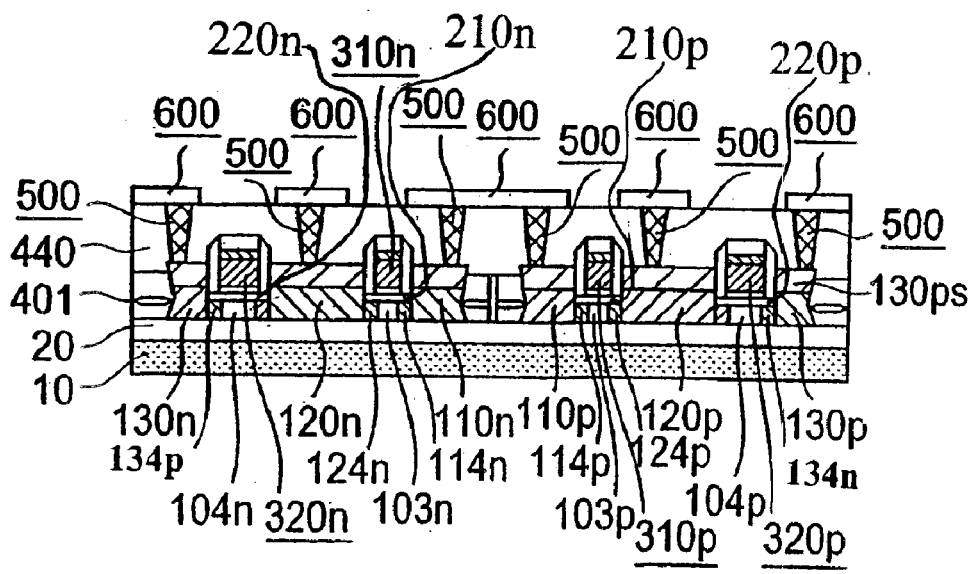
Figure 8A:
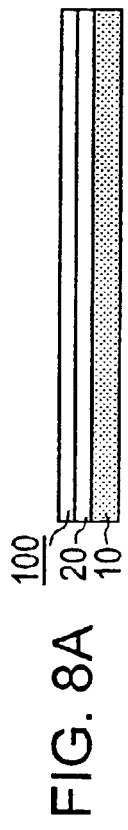
FIGS. 8A to 8G are diagrams showing a manufacture process for the embodiment shown in FIGS. 7A and 7B.
Figure 8B:
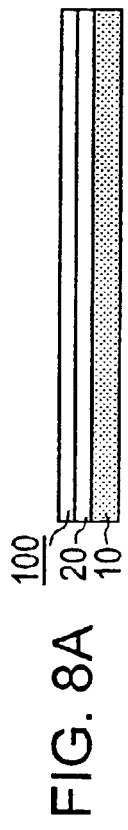
Figure 8C:
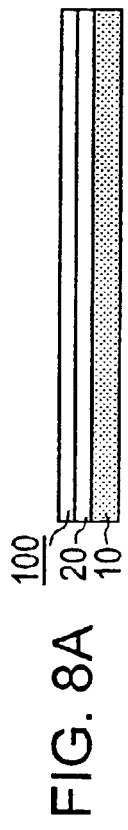
Figure 8D:
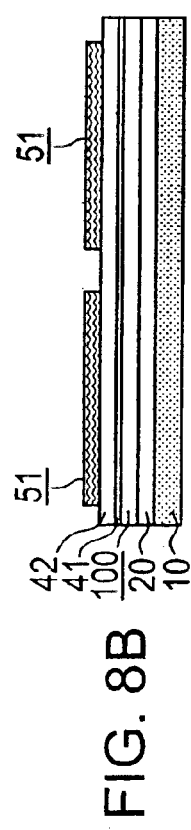
Figure 8E:
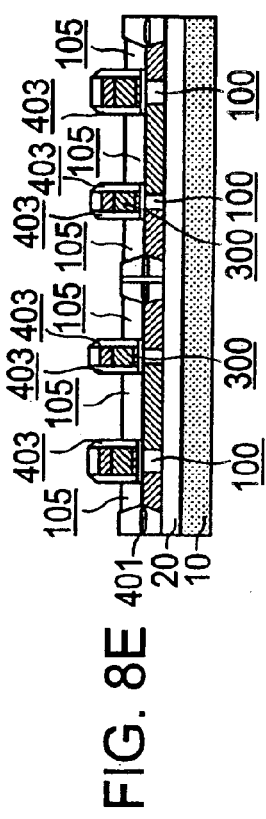
Figure 8F:
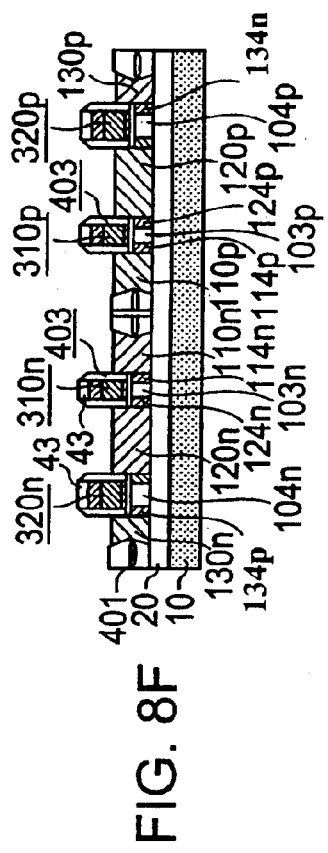
Figure 8G:
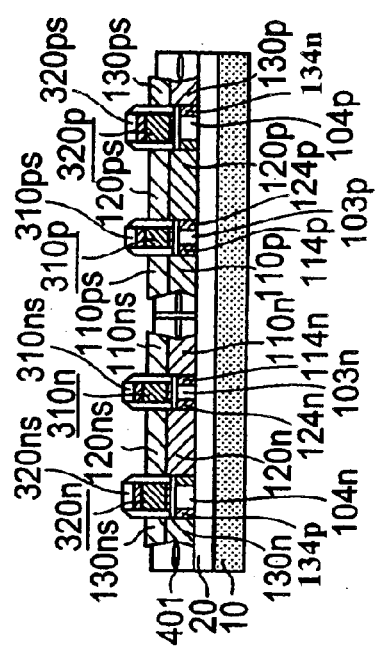

FIGS. 7A and 7B show an example of building a semiconductor integrated circuit from the circuit of FIG. 6. FIG. 7A is a plan view thereof and FIG. 7B is a sectional view taken along the line 7B—7B in FIG. 7A.

Reference symbol 10 denotes a supporting substrate, which, in this example, is an n type silicon <100>plane wafer of high resistance. Denoted by 20 is a silicon oxide film with a thickness of 100 nm. 103n and 103p represent portions of semiconductor thin films of an n-channel MOS transistor and a p-channel transistor, respectively. The semiconductor thin film portions 103n and 103p are each about 30 nm in thickness and form channels. 104n and 104p represent extended portions of the semiconductor thin films of the n-channel and p-channel MOS transistors, respectively, and the extended portions 104n and 104p serve as channels of carriers of the opposite conductivity type. 110n and 110p represent drains (first semiconductor regions) of the transistors. 120n and 120p are sources (second semiconductor regions) of the transistors. 130n and 130p are third semiconductor regions of the transistors and have the opposite conductivity type. 210n and 210p are first gate oxynitride films of the transistors and each have a thickness of 2.7 nm. 220n and 220p are second gate oxynitride films of the transistors. 310n and 320n are continuous first and second conductive gates of the n-channel transistor. 310p and 320p are continuous first and second conductive gates of the p-channel transistor. The first conductive gates are each 100 nm in length and, in this embodiment, formed of a laminate of a silicon thin film and a silicon germanium thin film. The first, second, and third semiconductor regions include semiconductor films that are formed on the semiconductor thin films through epitaxial growth.

A manufacture process of this embodiment is described below with reference to sectional views of FIGS. 8A to 8G and FIG. 7B.

(a) A highly resistive silicon wafer is used as a supporting substrate 10 and a silicon oxide film 20 with a thickness of about 100 nm and a silicon thin film 100 which has an n type impurity concentration of about $4 \times 10^{17}$ atoms/cc and which has a thickness of about 35 nm are layered on the substrate to prepare an SOI substrate.

(b) On the thus obtained SOI, an oxide film 41 is let grow until it reaches a thickness of about 7 nm by thermal oxidation and a silicon nitride film 42 with a thickness of about 50 nm is formed thereon by CVD. Thereafter, a photoresist pattern 51 is formed by known photolithography to leave portions of the silicon thin film in transistor regions.

(c) Using the photoresist pattern 51 as a mask, the silicon nitride film is etched under etching conditions that provide a selective ratio with respect to the silicon oxide film. The photoresist pattern is then removed and the substrate surface is cleaned. The exposed surface of the silicon oxide film which is exposed by the removal of the silicon nitride film is oxidized by pyrogenic oxidation until a silicon oxide film 401 grows to a thickness of about 60 nm. Through this step, the silicon thin film 100 is divided into pieces each of which makes a transistor. Alternatively, a known STI (shallow trench isolation) technique may be used to divide the silicon thin film.

The silicon nitride film 42 is removed by a hot phosphoric acid-based etchant and the silicon oxide film 41 is removed by a buffered hydrofluoric acid-based etchant to expose the surface of the silicon thin film 100. A silicon oxide film 200 is formed on the surface of the silicon thin film 100 by thermal oxidation to a thickness of 2.7 nm. Thereafter, ECR (Electron Cyclotron Resonance), ICP (Inductively Coupled Plasma), or like other high density plasma apparatus is used for surface nitrogenization at a nitrogenization ratio of 5 to 7% by introducing nitrogen radical from plasma of nitrogen gas with hydrogen gas, or with xenon gas to the substrate surface and setting the substrate temperature to 400° C. Then the substrate is transferred in a highly pure nitrogen gas atmosphere and subjected to heat treatment at 800° C. in nitrogen to anneal surface defects. The silicon oxide film nitrided is used as the first and second gate oxide films.

(d) Next, a conductive gate thin film 300 is formed by deposition. For the first 10 nm or so, pure silicon is deposited to form a pure silicon thin film 301. Then a silicon germanium thin film 302 which contains about 60% of germanium and which is doped with boron is formed by deposition to a thickness of 200 nm. Boron-doped silicon is then deposited to a thickness of about 50 nm to form a boron-doped silicon thin film 303. The source gases used are mono-silane (SiH4), germane (GeH4), and di-borane ($B_2H_6$). A silicon nitride film 43 is formed thereon to a thickness of about 100 nm.

The initial pure silicon thin film is formed by deposition in order to homogenize the composition of the subsequently-formed silicon germanium thin film, and to even out the microscopic fluctuation in the film thickness distribution. The germanium and boron in the film are diffused by the temperature and with time in the subsequent manufacture steps. Therefore the electric characteristic of the gate conductive film can be considered as that of boron-doped silicon germanium.

Using a known technique such as ArF lithography or electron beam lithography, a photoresist pattern for a conductive gate having a gate length of about 100 nm is formed on the above silicon nitride film/conductive gate thin film. The photoresist pattern is used as a mask in etching the silicon nitride film, the silicon film, the silicon germanium film, and the silicon film in order by the RIE technique.

A photoresist film shaped by photolithography and the silicon nitride film/conductive gate thin film are used as selection masks to selectively form, by ion implantation at low acceleration voltage (about 4 KeV for boron, about 15 KeV for arsenic), an extension region of the n type drain (114n), an extension region of the source (124n), an extension region of the n type third region (134p), an extension region of the p type drain (114p), an extension region of the source (124p), and an extension region of the p type third region (134n). In the implantation, the dose is set so as to obtain an impurity concentration of about $10^{19}$ atoms/cc (which corresponds to an ion implantation dose of about $3 \times 10^{13}$).

(e) Using a known gate side wall insulating film process, insulating film side walls 403 each having a thickness of about 40 nm are formed on the side walls of the first and second gates. The oxide films on the surfaces of the source and drain portions are subjected to wet etching to give the silicon thin film surfaces hydrogen-terminated faces. After that, a crystalline silicon layer 105 with a thickness of about 70 nm is selectively grown by a selective epitaxial technique on portions of the semiconductor thin film 100 that serve as the drains (110*n* and 110*p*), the sources (120*n* and 120*p*), and the third semiconductor regions (130*p* and 13 On).

(f) A photo resist film shaped by photolithography and the insulating film side walls 403 are used as masks in ion implantation of arsenic and boron for forming the n-channel drain (110*n*) and source (120*n*), the p-channel third semiconductor region (n type) (130*p*), the p-channel drain (110*p*) and source (120*p*), and the n-channel third semiconductor region (p type) (130*n*). The impurity ions are introduced not only to the crystalline silicon layer formed by selective epitaxial growth but also to the underlying SOI semiconductor thin film portions. In the implantation, the arsenic dose is set so as to obtain an impurity concentration of about $10^{21}$ atoms/cc and the boron dose is set to a value that makes the impurity concentration about $10^{20}$ atoms/cc.

(g) The silicon nitride film 43 on the conductive gate thin film (300) is subjected to wet etching by hot phosphoric acid or the like. The surface is then washed, nickel is deposited by evaporation to a thickness of about 20 nm, and sintering follows. The nickel on the insulating film that has not reacted is etched by an acid to leave a nickel silicide layer. Through high temperature sintering, silicide layers 110*ns* and 110*ps* are formed on the drains. Silicide layers formed at the same time are 120*ns* and 120*ps* on the sources, 130*ns* and 130*ps* on the third semiconductor regions, and 310*ns*, 320*ns*, 310*ps*, and 320*ps* on the gates.

A silicon oxide film is formed as an interconnection interlayer insulating film 440 by CVD on the surface. Contact holes are opened in the film as needed and contact plugs 500 are formed from titanium nitride, tungsten, or the like. Then an aluminum thin film is formed by evaporation. A wiring pattern is formed by photolithography and RIE (reactive ion etching) to obtain a first interconnection layer 600 (at this point, the state of FIG. 7B is reached). Thereafter, an interlayer insulating film and a multi-layer interconnection composed of a copper thin film or the like are formed as needed and, lastly, a passivation film is formed.

In the CMOS circuit formed as above, when the voltage of the third semiconductor regions is 0 V, the gate threshold voltage of the n-channel transistor is about 0.23 V and the gate threshold voltage of the p-channel transistor is about −0.2 V.

In the case of the above inverter circuit, if a voltage between 0.4 V and Vdd is applied to the third semiconductor region of the n-channel transistor before it reaches on the order of 10 picoseconds where an input signal is changed from 0 V to Vdd, Vth of the n-channel transistor is changed to about 0 V and a sufficient driving ability is obtained even when Vdd is about 0.4 V or so.

On the other hand, when an input signal changes from Vdd to 0V, a voltage between (Vdd−0.4) V and 0 V is applied to the third semiconductor region of the p-channel transistor before it reaches on the order of 10 picoseconds during which the change of the input signal is completed. Then Vth of the p-channel transistor is about 0 V and a sufficient driving ability is obtained.

The channel through which carriers of the opposite conductivity type are moved from the third semiconductor region is in the extended portion 104 of the semiconductor thin film. If a part of this channel is doped with an impurity having the first conductivity type (in the case where the semiconductor thin film is already doped with an impurity of the opposite conductivity type) or a high concentration impurity portion is formed in this channel, a barrier for preventing carriers of the opposite conductivity type from flowing back to the third semiconductor region can be obtained. In this way, the gate threshold voltage of the opposite conductivity type carrier channel viewed from the second conductive gate is shifted to the enhancement side.

In the above embodiment, instead of the extension region 134*n* of the p type third region, a portion having a different impurity concentration (higher impurity concentration, in this case) may be formed by arsenic implantation with the dose set to about $3 \times 10^{12}$ atoms/cm$^2$ in the channel of holes in the semiconductor thin film extended portion of the n-channel MOS transistor. This sets the gate threshold voltage with respect to holes to about −0.4 V, thereby shifting it toward the enhancement side than the gate threshold voltage of the first channel formation semiconductor thin film portion with respect to holes. A barrier against the holes injected into a channel-forming portion of the first semiconductor thin film portion is thus formed and the holes are no longer pushed back to the third semiconductor region 130*p* by the voltage of the first conductive gate which induces an n channel.

In the above embodiment, the conductive gates of the n-channel MOS transistor are formed of p type silicon and the first channel formation semiconductor thin film portion thereof has the n type conductivity and an impurity concentration of $4 \times 10^{17}$ atoms/cc, whereas the conductive gates of the p-channel MOS transistor are formed of n type silicon and the first channel formation semiconductor thin film portion of the p type MOS transistor has the p type conductivity and an impurity concentration of $4 \times 10^{17}$ atoms/cc. This sets the gate threshold voltage to 0.48 V for the n-channel transistor and to −0.48 V for the p-channel transistor when the electric potential of the third semiconductor regions is 0 V. By applying, before a gate signal is inputted, a voltage equal to or higher than 0.4 V to the third semiconductor region of the n-channel transistor and a voltage equal to or less than (Vdd 0.4) V to the third semiconductor region of the p-channel transistor, the absolute value of the gate threshold voltage becomes about 0.1 V. Accordingly, a high-speed CMOSLSI with very small leak current is obtained even when the power supply voltage is about 0.6 V.

On the other hand, if the first conductive gate is formed of n type silicon and the third conductive gate is formed of p type silicon in FIGS. 5A and 5B, Vth of the n-channel transistor is about 0.25 V and Vth of the p-channel transistor is about −0.25 V. Vth of the n-channel transistor is about 0.25 V and Vth of the p-channel transistor is about −0.25 V also when the first conductive gate is formed of p type silicon and the third conductive gate is formed of n type silicon. Designing a circuit in this manner makes it possible to stably control the concentration of carriers of the opposite conductivity type in the semiconductor thin film using the electric potential of the third semiconductor region.

When the electric potential of the third semiconductor region to the source is 0 V, the absolute value of Vth is almost 0.25 V whereas it is 0.05 V if the electric potential is 0.4 V. The electronic control is possible irrespective of what time interval is set for application of a control signal to the third semiconductor region. The impurity concentration of the semiconductor thin film is desirably zero. A desired thickness of the semiconductor thin film is ⅓ or less of the gate length in order to avoid punch through. Specifically, the thickness of the semiconductor thin film is desirably 7 nm or less if the gate is 20 nm in length. Desirable as a gate insulating film, the first gate insulating film and the third gate insulating film alike, is a 2 nm thick silicon oxide film whose surface is nitrogenized. An inverter, NAND, or NOR circuit composed of the transistors of this embodiment is small in stand-by current and large in drive current at a power supply voltage of 0.4 V.

In the above embodiment, a control signal to be applied to the third semiconductor region can be driven by an output of an inverter, NOR, or NAND two stages upstream. Then Vth of an inverter or the like can be controlled with one control signal if wires from the third semiconductor regions of the p-channel and n-channel transistors are interconnected.

When a circuit group composed of plural transistors is controlled as a group, third semiconductor regions of n-channel transistors in the group are interconnected to one another and the third semiconductor regions of p-channel transistors in the group are interconnected to one another. A control signal is given to the interconnection of the semiconductor regions of the n-channel transistors and another control signal is given to the interconnections of the third semiconductor regions of the p-channel transistors to control the stand-by power and the circuit switching speed.

In the present invention, the semiconductor thin film may be a silicon germanium single crystal thin film or a strained silicon/silicon germanium laminate other than a silicon single crystal thin film. The gate insulating film may be a silicon oxynitride film, a silicon nitride film, an alumina film, a hafnium oxide film, a film of a silicon-hafnium oxide mixture, a zirconium oxide film, or a film of a silicon-zirconium oxide mixture other than a silicon oxide film. The conductive gates may be a tungsten film, a titanium nitride film, or a titanium/titanium nitride laminate other than a polysilicon film or a silicon germanium film. The first, second, and third semiconductor regions may be formed not only in the semiconductor thin film but also on top of the semiconductor thin film, and a metal silicide film or a metal thin film may be added thereon to form a laminate. Thus the present invention can be carried out within a modification range which comes easy to the skilled in the art.

The first, second, and third semiconductor regions are described in this specification as "being in contact with" the semiconductor thin film. This contact state is obtained either by introducing impurity atoms into the semiconductor thin film and forming the first, second, and third semiconductor regions in the film or by forming the first, second, and third semiconductor regions on the semiconductor thin film by deposition.

The present invention is applicable to both PDSOI and FDSOI and, when applied to FDSOI, the present invention can provide effects that have been difficult to attain in the prior art.

The present invention makes it possible to electronically control Vth of not only PDSOI and bulk insulated gate transistors but also FDSOI and FDSON insulated gate transistors.

Furthermore, the present invention can enlarge the range of electronic control of the gate threshold voltage of double gate insulated gate transistors, which can be miniaturized further than the miniaturization limit of conventional MOS transistors. If a third conductive gate of a double gate insulated gate transistor is positioned in a lower part, the gate threshold voltage can be controlled merely by changing the electric potential of a third semiconductor region without establishing a connection from the third conductive gate to each transistor.

The present invention makes it possible to electronically control Vth of a transistor that has a larger channel mobility since a channel is induced at a lower impurity concentration of a semiconductor thin film in FDSOI than in PDSOI.

According to the present invention, a current flows from the third semiconductor region only when carriers of the opposite conductivity are injected and the current level necessary in a stable state is of about the carrier recombination current. With a conductive gate of the present invention which is formed of a semiconductor of the opposite conductivity type, the stand-by gate threshold voltage can be set far on the enhancement side. This makes it possible for an insulated gate transistor, even a fully depleted SO1 transistor, to have large ON current and small OFF current both at the same time.

What is claimed is:

1. A method of controlling an insulated gate transistor, comprising the steps of:

providing an insulated crate transistor comprised of a semiconductor thin film having a first main surface and a second main surface, a first gate insulating film formed on the first main surface of the semiconductor thin film, a first conductive gate formed on the first gate insulating film, first and second confronting semiconductor regions of a first conductivity type insulated from the first conductive gate and disposed in contact with the semiconductor thin film, and a third semiconductor region of a second conductivity type opposite to the first conductivity type and disposed in contact with the semiconductor thin film, the semiconductor thin film having a thickness and an impurity concentration so that an electric potential of the first conductive gate causes depletion of carriers between the first main surface and the second main surface of the semiconductor thin film between the first and second semiconductor regions and below the first conductive gate;

injecting carriers of the second conductivity type into the semiconductor thin film from the third semiconductor region; and thereafter applying a first electric potential to the first conductive gate to form a channel of the first conductivity type on a portion of the semiconductor thin film disposed between the first semiconductor region and the second semiconductor region.

2. A method according to claim 1; further comprising the step of controlling a gate threshold voltage of the first conductive crate using an electric potential of the third semiconductor region after the step of applying the first electric potential to the first conductive gate.

3. A method according to claim 1; wherein the providing step includes providing the insulated gate transistor having an end of the third semiconductor region disposed within a distance in which carriers of the second conductivity type are diffused from the portion of the semiconductor thin film disposed between the first semiconductor region and the second semiconductor region.

4. A method according to claim 1; wherein the providing step includes providing the insulated gate transistor in which the semiconductor thin film extends to the third semiconductor region from the portion of the semiconductor thin film disposed between the first semiconductor region and the second semiconductor region and in which a second gate insulating film is formed on the extended portion of the semiconductor thin film and a second conductive gate is disposed on the second gate insulating film.

5. A method according to claim 4; wherein the providing step includes providing the insulated gate transistor in which the first conductive gate and the second conductive gate are continuous.

6. A method according to claim 4; wherein the providing step includes providing the insulated gate transistor in which the third semiconductor region is in contact with the portion of the semiconductor thin film that is disposed between the first semiconductor region and the second semiconductor region and in which the second gate insulating film and the second conductive gate form the first gate insulating film and the first conductive gate, respectively.

7. A method according to claim 4; wherein the providing step includes providing the insulated gate transistor so that the second semiconductor region comprises a plurality of second semiconductor regions confronting the first semiconductor region and so that the third semiconductor region is disposed between the second semiconductor regions.

8. A method according to claim 1; wherein the providing step includes providing the insulated gate transistor having a third gate insulating film formed on a portion of the second main surface of the semiconductor thin film disposed between the first semiconductor region and the second semiconductor region and a second conductive gate disposed in contact with the third gate insulating film.

9. A method of controlling an insulated gate transistor, comprising the steps of:
providing an insulated gate transistor comprised of a semiconductor thin film having a first main surface and a second main surface, a first gate insulating film formed on the first main surface of the semiconductor thin film, a first conductive gate formed on the first gate insulating film, first and second confronting semiconductor regions of a first conductivity type insulated from the first conductive gate and disposed in contact with the semiconductor thin film, a third semiconductor region of a second conductivity type opposite to the first conductivity type and disposed in contact with the semiconductor thin film, a third gate insulating film formed on a portion of the second main surface of the semiconductor thin film disposed between the first semiconductor region and the second semiconductor region, and a third conductive gate disposed in contact with the third gate insulating film, an end of the third semiconductor region being disposed within a distance in which carriers of the second conductivity type diffuse from the portion of the second main surface of the semiconductor thin film; and
controlling a gate threshold voltage of the first conductive gate using an electric potential of the third semiconductor region.

10. A method of controlling an insulated gate transistor, comprising the steps of:
providing an insulated gate transistor comprised of a semiconductor thin film having a first main surface and a second main surface, a first gate insulating film formed on the first main surface of the semiconductor thin film, a first conductive gate formed on the first gate insulating a film, first and second confronting semiconductor regions of a first conductivity type insulated from the first conductive gate and disposed in contact with the semiconductor thin film, a third semiconductor region of a second conductivity type opposite to the first conductivity type and disposed in contact with the semiconductor thin film, a third gate insulating film formed on a portion of the second main surface of the semiconductor thin film disposed between the first semiconductor region and the second semiconductor region, and a third conductive gate disposed in contact with the third gate insulating film, the third conductive gate partially overlapping the third semiconductor region with the third gate insulating film being disposed therebetween; and
controlling a gate threshold voltage of the first conductive gate by an electric potential of the third semiconductor region.

11. A method according to claim 1; wherein the providing step includes providing the An insulated gate transistor in which the semiconductor thin film is formed on an insulating substrate.

12. A method according to claim 10; wherein the providing step includes providing the insulated gate transistor in which a surface portion of a substrate supporting the semiconductor thin film serves as the third conductive gate.

13. A method according to claim 1; wherein the providing step includes providing the insulated gate transistor in which at least an end of the semiconductor thin film is supported by a substrate.

14. A method according to claim 1; wherein the first conductive gate is formed of silicon of the second conductivity type.

15. A method according to claim 1; wherein the second conductive gate is formed of silicon of the second conductivity type.

16. A method according to claim 8; wherein the third conductive gate is formed of silicon of the second conductivity type.

17. A method according to claim 8; wherein the conductive gate is formed of silicon germanium of the second conductivity type.

18. A method according to claim 4; wherein the first and second conductive gates are formed from p-type silicon germanium container 45% to 60% of germanium in in average; and wherein the portion of the semiconductor thin film disposed between the first semiconductor region and the second semiconductor region contains an n-type impurity in a doss of $1.2 \times 10^{12}$ to $1.6 \times 10^{12}$ atoms/cm$^2$.

19. A method according to claim 4; wherein the first and second conductive gates are formed from a laminate of a p-type silicon germanium layer containing 45% to 60% of germanium in average and a silicon layer; and wherein the portion of the semiconductor thin film disposed between the first semiconductor region and the second semiconductor region contains an n-type impurity in a dose of $1.2 \times 10^{12}$ to $1.6 \times 10^{12}$ atoms/cm$^2$.

20. A method according to claim 5; wherein a portion having a higher impurity concentration than the portion of the semiconductor thin film disposed the first semiconductor region and the second semiconductor region is formed in the extended portion of the semiconductor thin film leading to the third semiconductor region.

21. A method according to claim 5; wherein the semiconductor thin film is doped with an impurity of the second conductivity type; and wherein the extended portion of the semiconductor thin film is doped with an impurity of the first conductivity type.

22. A method according to claim 2; wherein the providing step includes providing the insulated gate transistor having an end of the third semiconductor region disposed within a distance in which carriers of the second conductivity type are diffused from the portion of the semiconductor thin film disposed between the first semiconductor region and the second semiconductor region.

23. A method according to claim 2; wherein the providing step includes providing the insulated gate transistor in which the semiconductor thin film extends to the third semiconductor region from the portion of the semiconductor thin film disposed between the first semiconductor region and the second semiconductor region and in which a second gate insulating film is formed on the extended portion of the semiconductor thin film and a second conductive gate is disposed on the second gate insulating film.

24. A method according to claim 23; wherein the providing step includes providing the insulated gate transistor in which the first conductive gate and the second conductive gate are continuous.

25. A method according to claim 24; wherein the first and second conductive gates are formed from a p-type silicon germanium containing 45% to 60% of germanium in average; and wherein the portion of the semiconductor thin film disposed between the first semiconductor region and the second semiconductor region contains an n-type impurity in a dose of $1.2 \times 10^{12}$ to $1.6 \times 10^{12}$ atoms/cm$^2$.

26. A method according to claim 24; wherein the first and second conductive gates are formed from a laminate of a p-type silicon germanium layer that contains 45% to 60% of germanium in average and a silicon layer; and wherein the portion of the semiconductor thin film disposed between the first semiconductor region and the second semiconductor region contains an n-type impurity in a dose of $1.2 \times 10^{12}$ to $1.6 \times 10^{12}$ atoms/cm$^2$.

27. A method according to claim 24; wherein a portion having a higher impurity concentration than the portion of the semiconductor thin film disposed the first semiconductor region and the second semiconductor region is formed in the extended portion of the semiconductor thin film leading to the third semiconductor region.

28. A method according to claim 24; wherein the semiconductor thin film is doped with an impurity of the second conductivity type; and wherein the extended portion of the semiconductor thin film is doped with an impurity of the first conductivity type.

29. A method according to claim 23; wherein the providing step includes providing the insulated gate transistor in which the third semiconductor region is in contact with the portion of the semiconductor thin film that is disposed between the first semiconductor region and the second semiconductor region and in which the second gate insulating film and the second conductive gate form the first gate insulating film and the first conductive gate, respectively.

30. A method according to claim 23; wherein the providing step includes providing the insulated gate transistor in which the second semiconductor region comprises a plurality of second semiconductor regions confronting the first semiconductor region and the third semiconductor region is disposed between the second semiconductor regions.

31. A method according to claim 23; wherein the second conductive gate is formed of silicon of the second conductivity type.

32. A method according to claim 23; wherein the first and second conductive gates are formed from p-type silicon germanium containing 45% to 60% of germanium in average; and wherein the portion of the semiconductor thin film disposed between the first semiconductor region and the second semiconductor region contains an n-type impurity in a dose of $1.2 \times 10^{12}$ to $1.6 \times 10^{12}$ atoms/cm$^2$.

33. A method according to claim 23; wherein the first and second conductive gates are formed from a laminate of a p-type silicon germanium layer containing 45% to 60% of germanium in average and a silicon layer; and wherein the portion of the semiconductor thin film disposed between the first semiconductor region and the second semiconductor region contains an n-type impurity in a dose of $1.2 \times 10^{12}$ to $1.6 \times 10^{12}$ atoms/cm$^2$.

34. A method according to claim 2; wherein the providing step includes providing the insulated gate transistor having a third gate insulating film formed on a portion of the second main surface of the semiconductor thin film disposed between the first semiconductor region and the second semiconductor region and a second conductive gate disposed in contact with the third gate insulating film.

35. A method according to claim 34; wherein the providing step includes providing the insulated gate transistor in which a surface portion of a substrate supporting the semiconductor thin film serves as the third conductive gate.

36. A method according to claim 34; wherein the third conductive gate is formed of silicon of the second conductivity type.

37. A method according to claim 2; wherein the providing step includes providing the insulated gate transistor in which the semiconductor thin film is formed on an insulating substrate.

38. A method according to claim 2; wherein the providing step includes providing the insulated gate transistor in which at least an end of the semiconductor thin film is supported by substrate.

39. A method according to claim 2; wherein the first conductive gate is formed of silicon of the second conductivity type.

40. A method according to claim 2; wherein the conductive gate is formed of silicon germanium of the second conductivity type.

41. A method according to claim 5; wherein the first and second conductive gates are formed from p-type silicon germanium containing 45% to 60% of germanium in average; and wherein the portion of the semiconductor thin film disposed between the first semiconductor region and the second semiconductor region contains an n-type impurity in a dose of $1.2 \times 10^{12}$ to $1.6 \times 10^{12}$ atoms/cm$^2$.

42. A method according to claim 5; wherein the first and second conductive gates are formed from a laminate of a p-type silicon germanium layer containing 45% to 60% of germanium in average and a silicon layer; and wherein the portion of the semiconductor thin film disposed between the first semiconductor region and the second semiconductor region contains an n-type impurity in a dose of $1.2 \times 10^{12}$ to $1.6 \times 10^{12}$ atoms/cm$^2$.

43. A method according to claim 8; wherein the providing step includes providing the insulated gate transistor in which a surface portion of a substrate supporting the semiconductor thin film serves as the third conductive gate.

* * * * *